US005618185A

United States Patent [19]
Aekins

[11] Patent Number: 5,618,185
[45] Date of Patent: *Apr. 8, 1997

[54] CROSSTALK NOISE REDUCTION CONNECTOR FOR TELECOMMUNICATION SYSTEM

[75] Inventor: Robert A. Aekins, Stratford, Conn.

[73] Assignee: Hubbell Incorporated, Orange, Conn.

[*] Notice: The term of this patent shall not extend beyond the expiration date of Pat. No. 5,432,484.

[21] Appl. No.: 404,547

[22] Filed: Mar. 15, 1995

[51] Int. Cl.$^6$ ...................................................... H01R 9/09
[52] U.S. Cl. ............................... 439/76.1; 333/1; 174/34; 439/941
[58] Field of Search ................... 439/76.1, 941, 439/676, 638; 333/1, 12; 174/34

[56] References Cited

U.S. PATENT DOCUMENTS

| | | | |
|---|---|---|---|
| 3,764,727 | 10/1973 | Balde | 174/33 |
| 4,362,899 | 12/1982 | Borrill | 174/36 |
| 4,498,122 | 2/1985 | Rainal | 361/414 |
| 4,785,135 | 11/1988 | Ecker et al. | 174/34 |
| 5,039,965 | 8/1991 | Higgins | 333/182 |
| 5,295,869 | 3/1994 | Siemon et al. | 439/620 |
| 5,414,393 | 5/1995 | Rose et al. | 333/1 |
| 5,432,484 | 7/1995 | Klas et al. | 439/676 |

FOREIGN PATENT DOCUMENTS

| | | |
|---|---|---|
| 1382013 | 1/1975 | United Kingdom . |
| 1440392 | 6/1976 | United Kingdom . |
| 1449209 | 9/1976 | United Kingdom . |
| 2089122 | 6/1982 | United Kingdom . |

OTHER PUBLICATIONS

Freeman, R., "Telecommunications for System Engineering" 2d Ed., New York, Wiley Publishing, 1989, p. 54.

Landcaster, G., "Introduction to Fields And Circuits", Oxford Science Publications, 1992, pp. 176–184.

Moore, R.K., "Traveling-Wave Engineering", Mcgraw-Hill Electrical and Electronics Engineering Series, 1960, pp. 170–177.

Ryder., J.D., "Networks, Lines and Fields" Prentice-Hall, Inc., 1959, pp. 535–545.

Primary Examiner—Neil Abrams
Assistant Examiner—Barry Matthew L. Standig
Attorney, Agent, or Firm—Jerry M. Presson; Mark S. Bicks

[57] ABSTRACT

A connector for communications systems includes four input terminals and four output terminals in ordered arrays. A circuit electrically couples respective input and output terminals and cancels crosstalk induced across adjacent connector terminals. The circuit includes four conductive paths between the respective input and output terminals. Sections of two adjacent paths are in close proximity and cross each other between the input and output terminal. At least two of the paths have sets of vias connected in series between the input and output terminals. The sets of vias are adjacent.

23 Claims, 4 Drawing Sheets

FIG. 4A
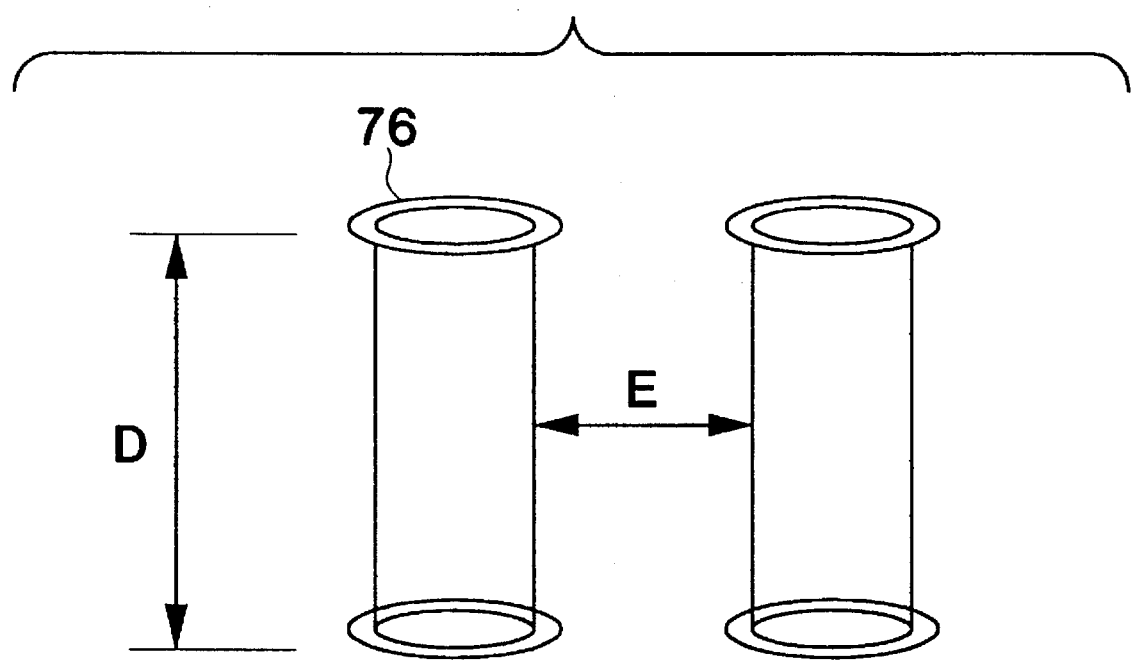
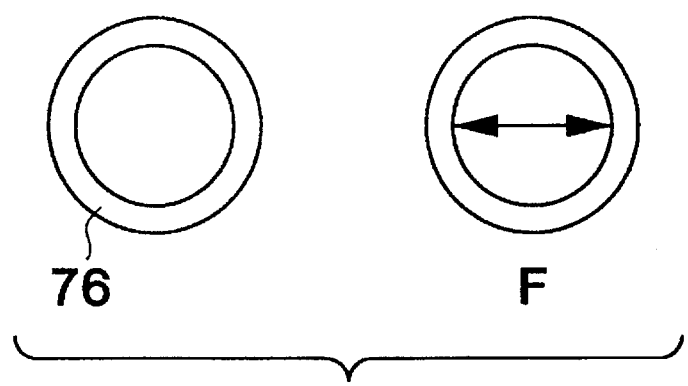
FIG. 4B

CROSSTALK NOISE REDUCTION CONNECTOR FOR TELECOMMUNICATION SYSTEM

REFERENCE TO RELATED APPLICATIONS

This application is related to U.S. patent application Ser. No. 07/932,194 of Klas et al filed Aug. 20, 1992 and entitled Connector For Communication Systems with Cancelled Crosstalk, now U.S. Pat. No. 5,432,484, and to U.S. patent application Ser. No. 08/002,871 of Rose et al filed Jan. 15, 1993 and entitled Telecommunication Connector With Feedback, now U.S. Pat. No. 5,414,393, the subject matter of each application is hereby incorporated by reference.

FIELD OF THE INVENTION

The present invention relates to connectors for telecommunications systems in which crosstalk induced between adjacent terminals of the connectors is reduced. More particularly, the present invention relates to connectors with plural pairs of input and output terminals in which the respective input and output terminals are connected by conductive paths provided with vias and arranged in a manner to reduce crosstalk induced in the connector terminals.

BACKGROUND OF THE INVENTION

The wide acceptance of unshielded twisted pair (UTP) systems for data and voice transmission is due to the large installed base of systems, their low cost and ease of new installation. Increased demands on networks using UTP systems, such as transmission rates, have forced the development of industry standards for higher system performance. Systems for simple telephone service and low speed network systems have become high speed data systems. As the speeds have increased, so too has system noise, in particular, near end crosstalk (NEXT).

For any data transmission event, the received signal will include the transmission signal, which is modified by various distortions. The various distortions are added by the transmission system, along with additional unwanted signals that are inserted somewhere between transmission and reception. The unwanted signals are referred to as noise. This noise is the major limiting factor in the current performance of communication systems. Problems that arise from noise are data errors, system malfunctions and loss of the actual wanted signals.

Noise may be divided into four categories, thermal noise, intermodular noise, impulse noise, and crosstalk. This invention is directed to crosstalk noise.

Crosstalk noise occurs when a signal from one source is coupled to another line. Crosstalk noise could also be classified as electromagnetic interference (EMI). EMI occurs through the radiation of electromagnetic energy. Electromagnetic energy waves can be derived by Maxwell's wave equations. These equations are basically defined using two components, electric and magnetic fields. In unbounded free space a sinusoidal disturbance propagates as a transverse electromagnetic wave (TEM wave). The electric field vectors are perpendicular to the magnetic field vectors which lie in a plane perpendicular to the direction of the wave. When one transmission pair (line A) is next to another pair (line B), crosstalk coupling can occurs. The fields are either capacitively (electric) or inductively (magnetic) coupled or both from line A to line B.

Crosstalk in a communication system can be minimized by decreasing the signal's power, increasing the distance between signal lines, providing shielding between signal lines, or twisting the wires of a pair. In a differential signaling communication system, plugs like RS-422A 25-pin, EIA T568B (AT&T) and ISDN 8-pin (ISO 8877) have predefined contact assignments. The predefined contact layouts eliminate all of the above crosstalk reduction methods, because restructuring is not an option. The ISO 8877 8-pin plug assignments and other similar plugs are not designed for high frequency use. These plugs produce crosstalk by the nature of their design. For example, a standard plug may have the following assignments for its eight pins: pin 1, power source; pin 2, power source; pin 3; transmit TA; pin 4, receive RA; pin 5, receive RB; pin 6, receive TB; pin 7, power sink; and pin 8, power sink.

Crosstalk in conventional plugs will increase as the speeds or system transmission frequencies increase. Crosstalk generated in the cable is minimized by the transposition (twisting) of the transmitting pair wires. However, as the signal travels through untwisted sections such as plugs and plug contacts, coupling occurs.

The transmitting signal could represent two signals in a differential balance signal system. In a differential balance transmission system, the signals traveling along a media are equal in amplitude, but opposite in phase. The phase difference of the two signals is $\pm\eta$ radian or voltage $1(E1)=-$voltage $2(-E2)$ under ideal conditions. These signals at any instantaneous time couple electric and/or magnetic fields to adjacent lines which reduces their signal to noise ratio (S/N). The acceptable S/N ratio depends on the type or quality of service that is required by the system. To remove the noise components, a signal equal, but opposite, to the original signal is induced. According to Fourier's wave theory and Maxwells theory of electromagnetic fields, coupling the opposite phase, i.e. $+\phi$, of the transmitted signal to a previously coupled adjacent line signal, i.e. $-\phi$, the two signals cancel each other completely, thereby removing the noise from the adjacent line.

SUMMARY OF THE INVENTION

An object of the present invention is to provide a connector for communication systems which will effectively reduce crosstalk and improve system signal to noise ratios.

Another object of the present invention is to provide a connector with reduced crosstalk without shielding and without changing the standard connector geometry and pinout definitions.

A further object of the present invention is to provide a connector with reduced crosstalk which is simple and inexpensive to manufacture and use.

The foregoing objects are basically obtained by a connector for communications systems, comprising first, second, third and fourth input terminals arranged in a first ordered array, first, second, third and fourth output terminals arranged in a second ordered array, and circuit means for electrically coupling each of the input terminals to the respective output terminal and for canceling crosstalk induced across the adjacent connector terminals. The circuit means includes first, second, third and fourth conductive paths between the respective input and output terminals. Sections of a first pair of two of the paths are adjacent each other and in relatively close proximity and cross each other between the input and output terminals. At least one path of said first pair has a first set of vias connected in series between the input and output terminals. At least one path of a second pair of the other paths having a second set of vias connected in series between the input and output terminals. The first and second sets of vias are adjacent.

By forming the connector in this manner, the crosstalk noise is reduced without requiring new equipment and wiring. The connector will reduce crosstalk noise regardless of whether the induced crosstalk results from magnetic (inductive) coupling or electric (capacitive) coupling, or from a combination of both couplings.

The circuit means simulates short monopole air radiation (SMAR). SMAR's are open ended via holes which are load to source path connected and used for radiating and receiving signals. By having the vias load to source path connected, stronger signal transmission and via coupling can be achieved. The energy that radiates is small in magnitude, but effective enough to induce coupling. Vias are plated-through holes used only for a signal trace, not a component lead.

To couple the right signal to the right line, transposition methods are employed. In transposition methods, each side of the transmitting signal in a differential system is equally coupled to adjacent lines. For example, RA is coupled to TB, and RB is coupled to TA, for worse case conditions. The SMAR methods could be used in other cases besides worse case conditions. The amount of induced signal using the SMAR technique depends on the combination design. The factors controlling SMAR coupling are the via's length and width, dielectric material, and the via's separation distance from each other.

The crosstalk noise is eliminated by, for example, the energy induced onto one path of the first pair from the other path of the first pair signal line being approximately cancelled by coupling energy to one path of the second pair whose vias are in close proximity carrying equal and opposite signals. This operation is accomplished by using the SMAR techniques. By using the SMAR technique, the amount of unwanted signals can be adjusted to cancel that which was injected by the combination, thus increasing the system's signal to noise ratio.

This technique provides a more laboratory controlled product than other crosstalk reduction designs, which greatly improves design time, efficiency and cost. This technique also effectively removes crosstalk using a smaller amount of printed circuit board space than most crosstalk reduction designs.

Other objects, advantages and salient features of the present invention will become apparent from the following more detailed description, which, taken in conjunction with the annexed drawings, discloses preferred embodiments of the invention.

BRIEF DESCRIPTION OF THE DRAWINGS

Referring to the drawings which form a part of this disclosure:

FIG. 4A is a perspective view graphically illustrating two vias for a printed circuit board using the SMAR technique according to the present invention;

FIG. 4B is a top plan view of the vias of FIG. 4A;

DETAILED DESCRIPTION OF THE INVENTION

Figure 1:
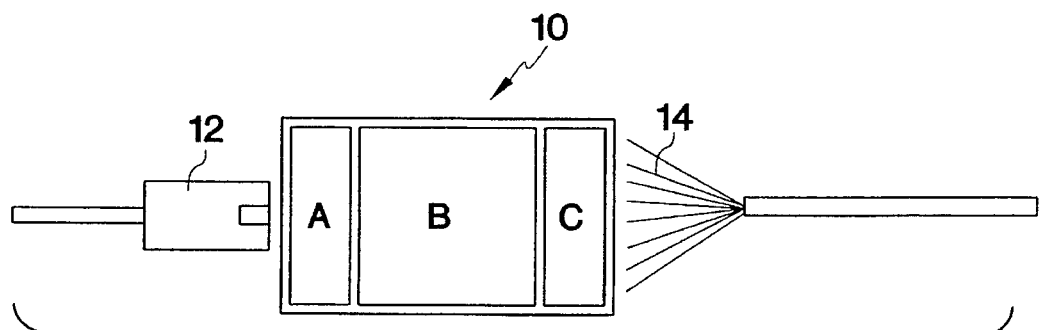
FIG. 1 is a block diagram graphically illustrating a communication connector and its input/output components according to the present invention.

Referring initially to FIG. 1, connector 10 bidirectional and could receive signal input from an RJ45 specification plug 12, twisted pair wires or other methods. The output of the connector could either be the plug, twisted pair wires 14, as illustrated, or other methods.

The communication connector is divided into three sections. The first section A is the conducting plug contacts layout which interfaces the board with the input/output plug. Section A is designed not to induce any additional crosstalk into second section B. The second section is the electric circuitry. The electric circuit in Section B performs the crosstalk reducing for the communication connector. Section B also connects the current paths from section A to section C. Section C is the connecting point for the input/output twisted pair cable. The section usually follows the twisted pair wiring standards for a tip and ring arrangement.

The input and output terminals are of conventional designs used in telephone and other communication systems for such connectors as jacks, patch panels and cross connects. The conventional details of the connector in the input section A and the output section C are not described in detail. Suitable connectors are disclosed in the U.S. patent application Ser. No. 08/236,141 to Gentry et al, as well as U.S. Pat. No. 4,648,678 to Archer and U.S. Pat. No. 5,061,029 to Bolick, the subject matter of each patent application and patent being incorporated herein by reference.

To achieve crosstalk reduction, it is important to know where the greatest source of noise is being produced at the connecting interface hardware. The interface connecting hardware includes a plug and metal contact pins coupled to the printed circuit board. The invention removes the coupled noise from adjacent lines which occurs from this combination. The worse case for a four pair connector involves the third, fourth, fifth and sixth pins. These pins are the worst case conditions because both sides of the transmitting and receiving signals are adjacent to each other. This layout could be in any pin combination and would provide the same results.

To remove crosstalk, electromagnetic field (EMF) induced coupling methods are used. This method involves inducing an opposite signal, i.e., E1 to −E2, to an adjacent transmission line whose noise originated from another transmitting signal.

Figure 2:
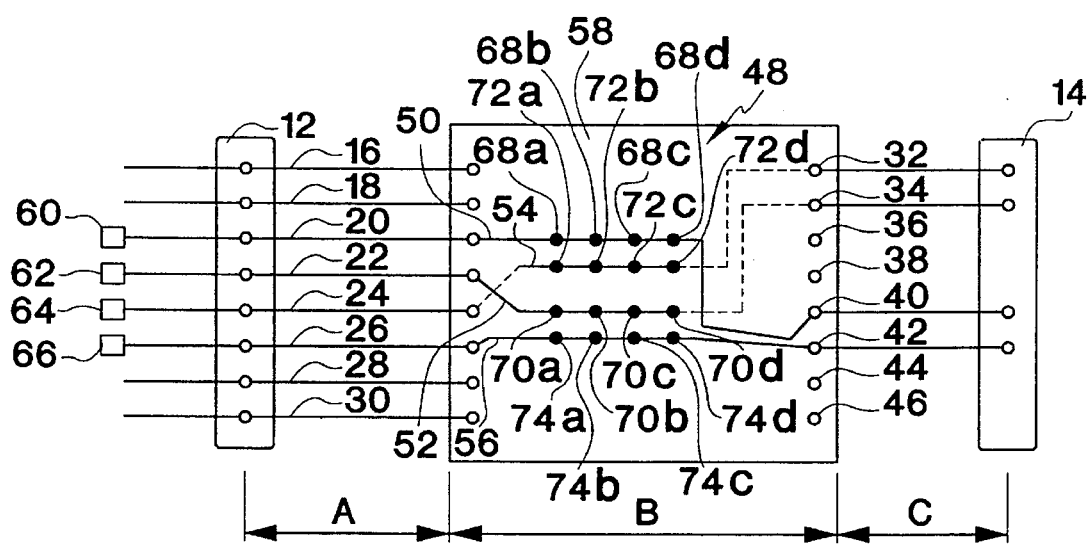
FIG. 2 is a schematic diagram of a connector for a communications system according to a first embodiment of the present invention.

In FIG. 2, the electrical signal circuit path is schematically illustrated. The diagram shows three sections. Section A includes the connector input/output for terminals 16, 18, 20, 22, 24, 26, 28 and 30 for the plug connection port. Section B is the circuit section. Section C includes terminals 32, 34, 36, 38, 40, 42, 44 and 46 of the input/output connection port for the twisted pair cable. Section B connects plug terminals 20, 22, 24 and 26 to cable terminals 40, 34, 32 and 42, respectively, such that crosstalk induced across adjacent terminals in sections A and C is cancelled in the circuit of section B.

Input section A uses present communication systems tip and ring layouts. Output section C uses present communication systems AT&T 110 blocks (AT&T symbol for twisted pair wire connection) layouts.

Circuit section B comprises a printed circuit board 48 with four printed circuit traces or conductive paths 50, 52, 54 and 56 on a substrate 58. Trace 50 extends between and connects terminal 20 and terminal 40. Trace 52 extends between and connects terminal 22 and terminal 34. Trace 54 extends between and connects terminal 24 and terminal 32. Trace 56 extends between and connects terminal 26 and terminal 42.

In communication systems, terminals 20, 22, 24 and 26 are connected to signal sources 60, 62, 64 and 66, respectively. The signals from sources 62 and 64 are equal and opposite (i.e., differentially driven) to each other. The signals from sources 60 and 66 are equal and opposite to each other.

Each path of each differentially driven pair has four open ended via holes, source to load path connected. Trace 50 is connected to vias 68 *a–d*. Trace 52 is connected to vias 70 *a–d*. Trace 54 is connected to vias 72 *a–d*. Trace 56 is connected to vias 74 *a–d*.

Each via of each trace has the same radius, length and thickness. The unity of via radius, length and thickness is necessary for peak field coupling. The separation distances of the vias are equal for each conductive path. The separation distance for vias in the two opposing paths 50 and 54 is equal to the separation distance of vias for traces 52 and 56. The via separation distances in traces 50 and 54 are twice the via overall width, which is needed for proper inductive coupling. The via paths 68 *a–d* and 72 *a–d* are transceivers to each other, i.e., each via path can transmit and receive a signal. The via pathes 70 *a–d* and 74 *a–d* are transceivers to each other. For optimal transceiver coupling the via pairs 68*a*/72*a*, 68*b*/72*b*, 68*c*/72*c* and 68*d*/72*d* from traces 50 and 54 are set within close proximity to each other and via pairs 70*a*/74*a*, 70*b*/74*b*, 70*c*/74*c* and 70*d*/74*d* from traces 52 and 56 are set within close proximity to each other.

The conductors coupled to sources 60, 62, 64 and 66 are the worse case condition for a four pair RJ45 plug input. The coupled crosstalk is first introduced at the inputs of plug 12. Additional unwanted coupling is introduced in section A at terminals 20, 22, 24 and 26. The output section C, at terminals 32, 34, 40 and 42 also induces unwanted coupling, but at a reduced degree compared to section A.

The traces 50, 52, 54 and 56, along with vias 68 *a–d*, 70 *a–d*, 72 *a–d* and 74 *a–d*, are designed on a two sided printed circuit board 48. The printed circuit board 54 is formed of dielectric material, which is copper plated on both sides.

Figure 3:
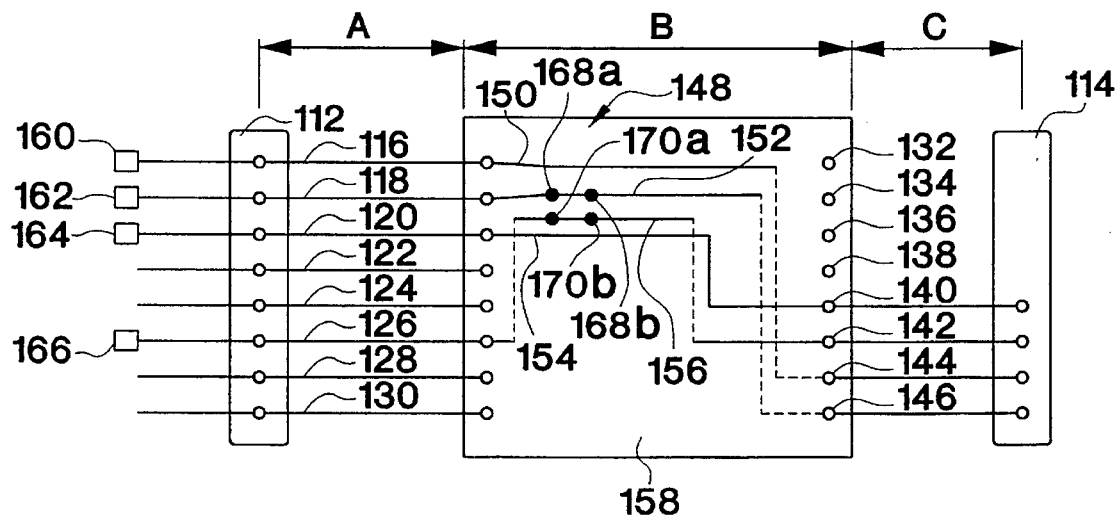
FIG. 3 is a schematic diagram of a connector for a communications system according to a second embodiment of the present invention.

Referring to FIG. 3, an electrical signal circuit path is schematically illustrated for SMAR usage. The diagram is drawn showing three sections. Section A includes the connector input terminals 116, 118, 120, 122, 124, 126, 128 and 130 for the plug connection port for plug 112. Section B is the circuit section. Section C includes output terminals 132, 134, 136, 138, 140, 142, 144 and 146 of the input/output connection port for the twisted pair cable 114. Section B connects the respective input and output terminals such that crosstalk induced in section A is removed by section B and sent to section C. The input section A uses a present communication systems tip and ring arrangement as in FIG. 2. The output section uses a present communication systems AT&T 110 block layout, as in FIG. 2.

The circuit section B comprises a printed circuit board 148 with four printed circuit traces or conductive paths 150, 152, 154 and 156 on a substrate 158. Trace 150 extends between and connects terminal 116 and terminal 144. Trace 152 extends between and connects terminal 118 and terminal 146. Trace 154 extends between and connects terminal 120 and terminal 140. Trace 156 extends between and contacts terminal 126 and terminal 142.

In communication systems, terminals 116, 118, 120 and 126 are connected to signal sources 160, 162, 164 and 166, respectively. The signals from sources 160 and 162 are equal and opposite (i.e., differentially driven) to each other. The signals from sources 164 and 166 are equal and opposite to each other.

One side of each differentially driven pair has two open ended via holes trace path connected. Trace 152 is connected to vias 168 *a–b*. Trace 156 is connected to vias 170 *a–b*. The vias of traces 152 and 156 are of the same radius, length and thickness, as in FIG. 2. The separation distances of the vias are equal for each conductive path. The via path 168 *a–b* and 170 *a–b* are transceivers to each other. For optimal transceiver coupling the via pairs 168 *a–b* and 170 *a–b* from traces 152 and 156 are set within close proximity to each other.

The inputs or signal sources 160, 162, 164 and 166 are the second worse case condition for a four pair RJ45 plug input, because only one side of a transmission line is adjacent to only one side of another transmission line. One pair is the combination of signal sources 160 and 162. The other pair is the combination of signal sources 164 and 166. The coupled crosstalk is first introduced at the plug inputs 112. Additional unwanted coupling is introduced at the section A conductive paths or terminals. The output section C conductive paths or terminals also induce unwanted coupling, but at a reduced degree relative to section A. The traces and vias are designed on a printed circuit board 148 with the same material as FIG. 2.

FIGS. 4A and 4B illustrate the vias used for the embodiments of FIGS. 2 and 3. The dimensions D, E and F provide some of the controlling factors using the SMAR design methods. The via's length is D, separating distances between signal and noise vias is E, and width is F. The ends of the vias have pads 76 on both sides for possible trace connections.

Figure 5:
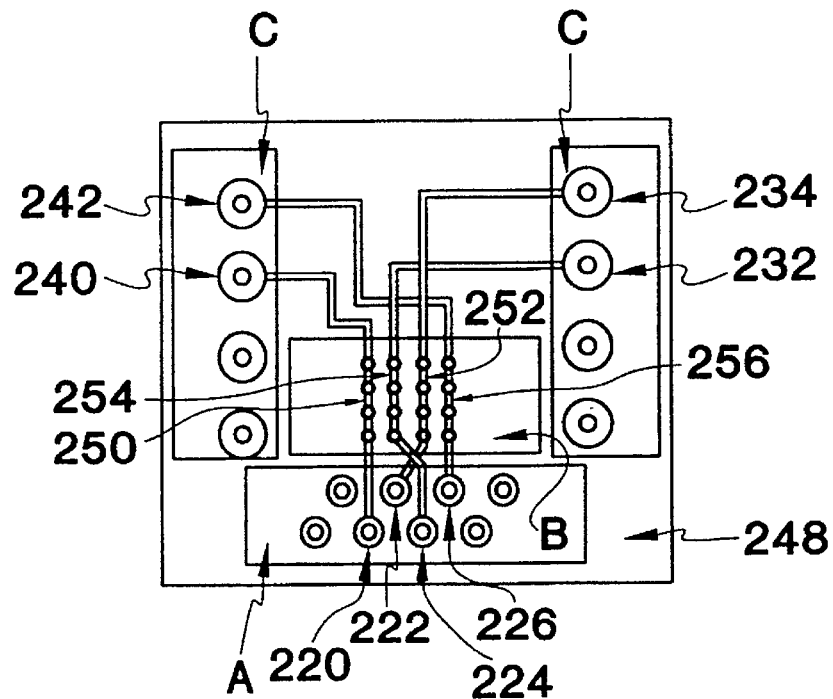
FIG. 5 is a plan view of a printed circuit board of a connector according to the first embodiment of the present invention.

FIG. 5 illustrates an example of the embodiment of FIG. 2 on a printed circuit board 24. The printed circuit board is divided into three sections. Section C connects the 110 block to the printed circuit board. Section B is the crosstalk reduction circuit. Section A connects the plug contacts to the printed circuit board. The inputs 220 and 226 and the respective outputs 240 and 242 represent one pair. The inputs 222 and 224 and the respective outputs 234 and 232 represent the other pair. In section A, inputs 220, 222, 224 and 226 involve the worst case condition, as described for FIG. 2. The conductive paths 250 and 254 are shown with four vias each for voltage induced coupling, with the dimensions explained in FIGS. 4A and 4B. The conductive paths 252 and 256 are shown with four vias each for voltage induced coupling with the dimensions explained for FIG. 4.

Figure 6:
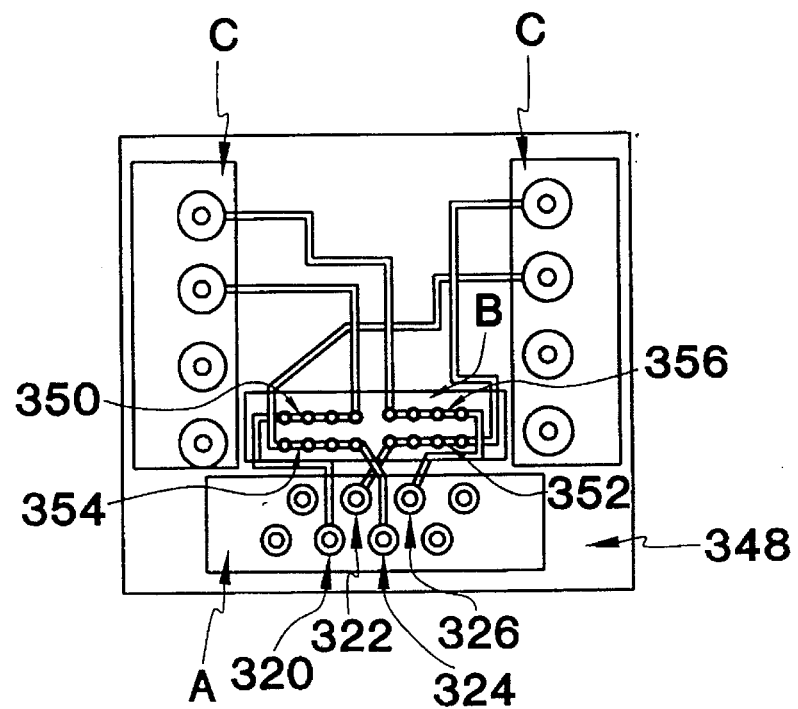
FIG. 6 is a plan view of a printed circuit board of a connector according to another embodiment of the present invention shown in a different layout.

FIG. 6 illustrates another example of the embodiment of FIG. 2 on a printed circuit board shown in horizontal layout. Section C connects the 110 block to the printed circuit board 348. Section B is the crosstalk reduction circuit. Section A connects the plug contacts to the printed circuit board. The inputs 320 and 326 exits through to the same 110 block contacts as FIG. 5. In section A, inputs 320, 322, 324 and 326 involve the worst case condition, as explained for FIG. 2. The conductive paths 350 and 354 are shown with four vias each for voltage induce coupling with the dimensions explained for FIGS. 4A and 4B. The signals which flow through the vias on trace paths 352 and 356 are in opposite directions for SMAR method coupling. The signals which flow through vias on trace paths 350 and 354 are also in opposite directions for SMAR method coupling.

The conductive traces in the embodiments of FIGS. 5 and 6 are not used for induced coupling, but are only used for source to load and via connection.

Figure 7:
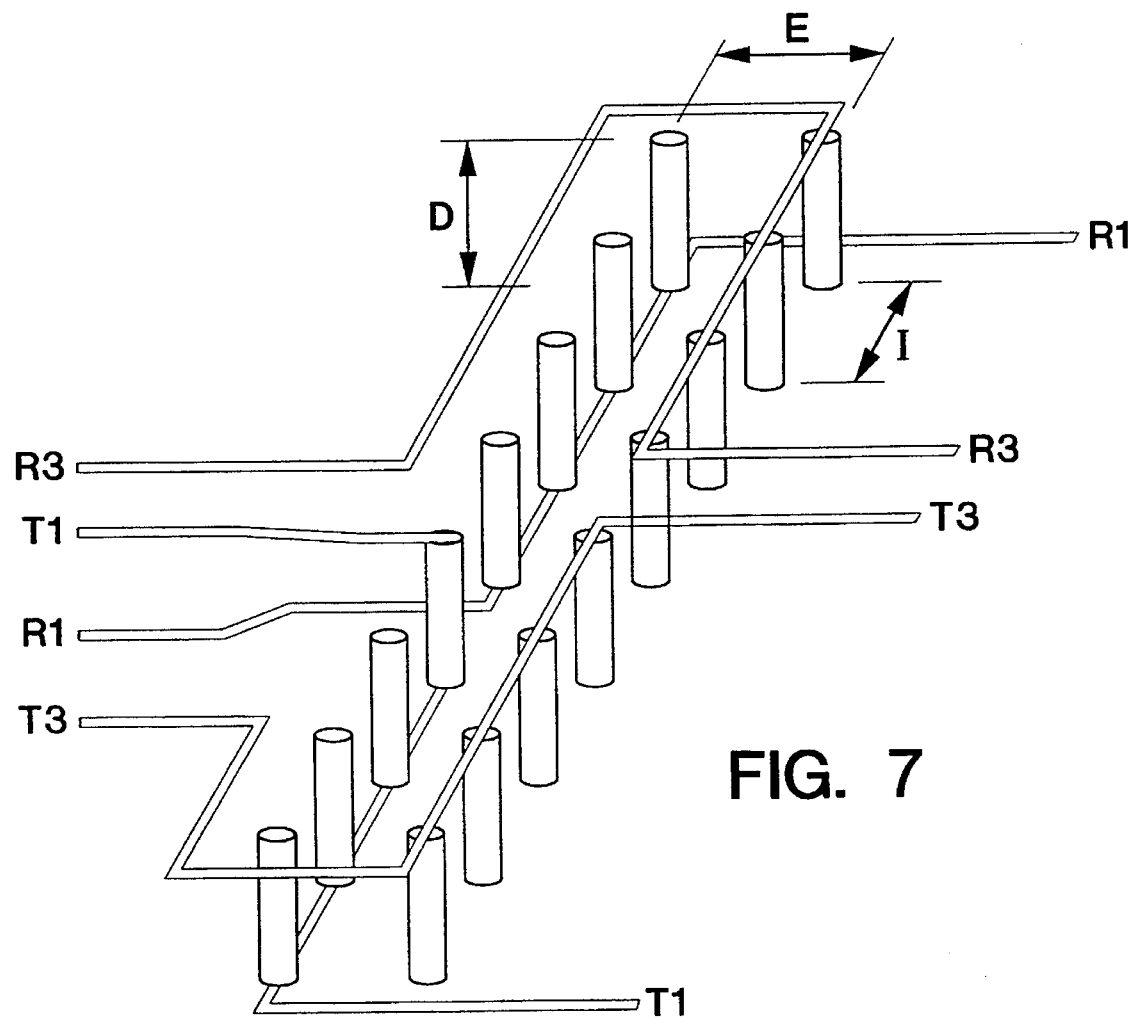
FIG. 7 is a perspective view graphically illustrating SMAR via holes on a printed circuit board according to the FIG. 6 embodiment of the present invention.

FIG. 7 is a three dimensional view of the via arrangement used for FIGS. 5 and 6 in section B. The dimensions D and E are explained in connection with FIG. 4A. The dimension I is the separating distance between common current load to source path vias. The respective inputs and outputs are labeled R3 (ring for pair 3), T1 (tip for pair 1), R1 (ring for pair 1), and T3 (tip for pair 3). The tip (tip—conductive contact of phone jack) and ring (ring—conductive contact around phone jack) are telecommunication symbols for two wire connections in a twisted pair wiring system. The vias are connected to conductive source to load path for stronger field coupling and optimal match frequency response. If the vias are not in the source to load current path, the chances of unwanted induced signal noise can arise, due to possible frequency propagation delays.

The printed circuit board, without additional physical components, provides the passive electrical reduction circuit. The printed circuit board elements combine conductivity and transmission theory in removing unwanted noise signals from a transmission line.

When a conductor is used at frequencies of greater than one megahertz the current flow is predominantly on the surface of the conductor, known as skin effect. Because of skin effect, the current will flow in a thin layer at the conductor surface. For high frequencies, the internal flux (amount of the electric fields radiating from a surface) and internal inductance (line inductance) of a line are reduced nearly to zero, and the current flows uniformly in the region between the surface and the interior of a thin walled, hollow conductor. Some representative values of the effective thickness (skin depth t) of copper conductive material are estimated as follows:

| Frequency | Copper Skin Depth |
| --- | --- |
| 1 kHz | 2 mm |
| 1 MHz | 70 μm |
| 100 MHz | 6.6 μm |

The skin depth information that is known for copper material is directly related to the printed circuit board base connector. By having a very thin skin depth at higher frequencies, vias which are not soldered filled can effectively be used, simplifying the board design. This design also uses a form of transposition, whereby electric field coupling methods are employed in reducing opposite fields in opposing lines. Electric field coupling in theory is capacitive, that is, it is a function of the capacitance between two lines. Since electric fields radiate best from high impedance sources, SMAR, a version of a monopole antenna, is used to produce this field.

SMAR is defined as short monopole air radiation. Short refers to the via's length compared to the radiated frequencies wavelengths. Monopole is defined as a single connected conductive antenna rod which radiates and receives electromagnetic fields. Air radiation is the radiation of far fields (radiation fields) and near fields (radiated coupling) in free air.

The SMAR arrangement used is implemented on a printed circuit board using via holes. The vias are arranged in an array periodic order. The current is essentially linear from feed to end because the vias are short relative to the signals wavelengths. The ends of a monopole are like open transmission line elements, where the current drops to zero and the voltage rises to twice its applied value due to its high impedance. The magnetic field is basically small. Therefore the controlling field is electric due to the high impedance source. The total magnetic field intensity (Hø) at any point using SMAR method is;

$$H\phi = (Im\ sin\theta dl/4n)\ [sin\ t/r^2 + (\omega/cr\ cos\ t)],$$

where
Im = the monopoles driven current,
dl = the current carriers conductive length,
r = the length of the magnetic fields radiations,
t = the skin depth of the current carrier,
c = the velocity of propagation, and
ω = 2×π×frequency The electric field radiates (air radiation) from the vias in all directions. This effect produces capacitive coupling, which is electric field coupling. The coupling that takes place is between the two opposing vias, signal via and noise via, as shown in FIG. 7, with D being the via height and I being the distance between vias. This form of capacitance coupling, when induced in transposing fashion reduces the previously coupled opposite polarity signal that was created from the printed circuit patchboard combination. The amount of induced electric field of the SMAR technique is controlled by varying distance between noise and signal vias, via height, number of vias used, the via radii, ratio of the number of signal line vias to the number of noise line vias, and the dielectric material of the printed circuit board.

To increase the amount of induced signal, the distance between signal and noise vias is reduced, the via width is increased or more paired vias are added, or dielectric is changed. To decrease the amount of induced signal, the opposite is provided.

The SMAR method induced radiation (IR) characteristic equation is as follows:

$$IR = Vh + Rv + \sqrt{I}/Vd + 2Vm + (Vs/Vn).$$

The constants, Vh, the via height, and Rv, the via radius, are minor controlling factors. The terms I/Vd and Vm are the major controlling factors. Vd is the separation distance between the signal and noise vias. Vm is the number of signal to noise via pair combinations. The constant 2 represents paired combinations and increases the important factor of its term Vm to the overall design. Signal via (Vs) and noise via (Vn) are used as a ratio function. The ratio of signal to noise vias using SMAR technique should equal one in most cases. The IR value calculated produces an optimal number which could be referenced for peak connector performance. The terms in the equation are set to reflect the overall effect of the IR technique. For example, if Vh=0.090", Rv=0.019", Vd=0.030", Vm=3 and Vs/Vn=1, the reference value for IR would be:

$$IR = 0.090 + 0.019 + \sqrt{I}/0.030 + 2(3) + 1 = 12.882.$$

If 12.882 is the optimal value, any changes above or below it would degrade the connector's overall performance. The optimal value would be determined by laboratory experiments. The increase or decrease of the IR value shows the effects each parameter has on system performance.

The SMAR technique is a function of the reciprocity theorem. Reciprocity in the system of the present invention is the usage of a monopole to be interchangeable The monopole can transmit and receive a signal, independently of the direction of the transmitting signal.

The monopole antennas created by via holes are not truly monopoles, since the vias are much less than quarter wavelength for true E & B field deductions. However, the via holes are virtual monopoles in their characteristics of electric and low magnetic field coupling.

The SMAR methods are electric and magnetic field inducing which are matched to specific printed circuit patchboard (PCP) combinations. This match is necessary, because the printed circuit patchboard has a set amount of induced crosstalk and the SMAR methods also have a set amount induced crosstalk to counter that noise. If any physical structure of the PCP combination is changed, an imbalance in coupling will result. The imbalance created will either improve or degrade the connector's noise reduction performance. For each different PCP combination a different SMAR arrangement must be used for peak performance. The matched pair array arrangement for SMAR is necessary to decrease the potential magnetic emission and susceptibility level of the circuit. If the circuit uses SMAR techniques without matched signal and noise vias, the circuit will be more susceptible to outside EMI, and can create longitudinal unbalances (unwanted line current noise) in a twisted paired differential driven system.

SMAR techniques are ideal when implemented on a printed circuit board, because of the small space that is required. The use of SMAR techniques also provide an efficient and effective method for reducing unwanted signals on a transmitting line.

The signal flow for the SMAR vias can be in either direction for SMAR coupling. The minimum number of vias for SMAR methods is two and shall be source to load path connected. The use is not restricted to eight vias per differential driven pairs, but to the system overall requirements. Similarly, the invention is not restricted to four pair differential driven communication systems.

While various embodiments have been chosen to illustrate the invention, it will be understood by those skilled in the art that various changes and modifications can be made therein without departing from the scope of the invention as defined in the appended claims.

What is claimed is:

1. A connector for communications systems comprising:

first, second, third and fourth input terminals arranged in a first ordered array;

first, second, third and fourth output terminals arranged in a second ordered array; and circuit means for electrically coupling said first, second, third and fourth input terminals to said first, second, third and fourth output terminals, respectively, and for canceling crosstalk induced across adjacent ones of said terminals, said circuit means including first, second, third and fourth conductive paths between said first, second, third and fourth terminals, respectively, sections of a first pair of two of said paths being adjacent each other in relatively close proximity and crossing over each other between said first array of said input terminals and said second array of said output terminals, at least one of said paths of said first pair having a first set of vias connected in series between said first array of said input terminals and said second array of said output terminals, at least one of said paths of a second pair of the other paths having a second set of vias connected in series between said first array of said input terminals and said second array of said output terminals, said first and second sets of vias being adjacent.

2. A connector according to claim 1 wherein the other paths of said first and second pairs have third and fourth sets of vias, respectively, said third and fourth sets of vias being adjacent and parallel.

3. A connector according to claim 2 wherein each set of vias comprises four vias.

4. A connector according to claim 2 wherein said second and third input terminals are between said first and fourth input terminals; and said first pair comprises said second and third paths, said second and third paths being in close proximity at connections thereof with said second and third input terminals.

5. A connector according to claim 1 wherein each set of vias comprises four vias.

6. A connector according to claim 1 wherein said second and third input terminals are between said first and fourth input terminals; and said first pair comprises said second and third paths, said second and third paths being in close proximity at connections thereof with said second and third input terminals.

7. A connector according to claim 1 wherein each set of vias comprises two vias.

8. A connector according to claim 7 wherein said first pair comprises said third and fourth paths, with said fourth path having said first set of vias;

said second pair comprises said first and second paths, with said second path having said second set of vias; and said second input terminal is adjacent to and between said first and third input terminals, said fourth input terminal being adjacent said third input terminal on a side thereof remote from said second input terminal.

9. A connector according to claim 1 wherein said first pair comprises said third and fourth paths, with said fourth path having said first set of vias;

said second pair comprises said first and second paths, with said second path having said second set of vias; and said second input terminal is adjacent to and between said first and third input terminals, said fourth input terminal being adjacent said third input terminal on a side thereof remote from said second input terminal.

10. A connector for communications systems, comprising:

first, second, third and fourth input terminals arranged in a first ordered array;

first, second, third and fourth output terminals arranged in a second ordered array; and printed wiring board means for electrically coupling said first, second, third and fourth input terminals to said first, second, third and fourth output terminals, respectively, said board means including a dielectric substrate having a first, second, third and fourth conductive paths printed thereon between said first, second, third and fourth terminals, respectively, sections of a first pair of two of said paths being adjacent each other and in relatively close proximity in an area of said board means and crossing each other between said first array of said input terminals and said second array of said output terminals, at least one of said paths of said first pair having a first set of vias connected in series in said substrate between said first array of said input terminals and said second array of said output terminals, at least one of said paths of a second pair of the other paths having a second set of vias connected in series in said substrate between said first array of said input terminals and said second array of said output terminals, said first and second sets of vias being adjacent;

said conductive paths and vias having lengths and widths and being relatively spaced on said substrate, and said substrate having a dielectric constant such that any induced crosstalk is approximately canceled.

11. A connector according to claim 10 wherein the other paths of said first and second pairs have third and fourth sets of vias, respectively, said third and fourth sets of vias being adjacent and parallel.

12. A connector according to claim 11 wherein each set of vias comprises four vias.

13. A connector according to claim 11 wherein said second and third input terminals are between said first and fourth input terminals; and said first pair comprises said second and third paths, said second and third paths being in close proximity at connections thereof with said second and third input terminals.

14. A connector according to claim 10 wherein each set of vias comprises four vias.

15. A connector according to claim 10 wherein said second and third input terminals are between said first and fourth input terminals; and said first pair comprises said second and third paths, said second and third paths being in close proximity at connections thereof with said second and third input terminals.

16. A connector according to claim 10 wherein each set of vias comprises two vias.

17. A connector according to claim 16 wherein said first pair comprises said third and fourth paths, with said fourth path having said first set of via;

said second pair comprises said first and second paths, with said second path having said second set of vias; and said second input terminal is adjacent to and between said first and third input terminals, said fourth input terminal being adjacent said third input terminal on a side thereof remote from said second input terminal.

18. A connector according to claim 10 wherein said first pair comprises said third and fourth paths, with said fourth path having said first set of vias;

said second pair comprises said first and second paths, with said second path having said second set of vias; and said second input terminal is adjacent to and between said first and third input terminals, said fourth input terminal being adjacent said third input terminal on a side thereof remote from said second input terminal.

19. A connector according to claim 10 wherein said input and output terminals comprise conductive pads on said substrate and spaced from said vias.

20. A connector according to claim 10 wherein each of said sets of vias are arranged in a substantially straight line.

21. A connector according to claim 10 wherein each of said sets of vias are connected by a portion of the respective path extending continuously on only one side of said substrate.

22. A connector according to claim 21 wherein said portions of said paths located on a single side of said substrate.

23. A connector according to claim 22 wherein the respective portions of said paths are located on opposite sides of said substrate.

* * * * *